(12) United States Patent
Vrinten et al.

(10) Patent No.: US 7,304,476 B2
(45) Date of Patent: Dec. 4, 2007

(54) SHIELDED TREATMENT ROOM AND DEVICE SUITABLE FOR RECORDING IMAGES ON THE BASIS OF MAGNETIC RESONANCE

(75) Inventors: Marinus L. A. Vrinten, Eindhoven (NL); Cornelis L. G. Ham, Eindhoven (NL); Robert P. Kleihorst, Eindhoven (NL); Gerardus B. J. Mulder, Eindhoven (NL); Paulus C. H. A. Haans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1 day.

(21) Appl. No.: 10/595,474

(22) PCT Filed: Oct. 22, 2004

(86) PCT No.: PCT/IB2004/052177

§ 371 (c)(1),
(2), (4) Date: Apr. 21, 2006

(87) PCT Pub. No.: WO2005/043181

PCT Pub. Date: May 12, 2005

(65) Prior Publication Data

US 2007/0170918 A1   Jul. 26, 2007

(30) Foreign Application Priority Data

Oct. 29, 2003   (EP)   ................. 03104001

(51) Int. Cl.
*G01V 3/00*   (2006.01)
(52) U.S. Cl. ...................... 324/318; 324/322

(58) Field of Classification Search ........ 324/300–322; 600/407–445
See application file for complete search history.

(56) References Cited

U.S. PATENT DOCUMENTS 5,577,752 A * 11/1996 Johnson ................... 280/432

(Continued)

FOREIGN PATENT DOCUMENTS

EP   0 864 673 A2   9/1998

(Continued)

*Primary Examiner*—Brij Shrivastav (57) ABSTRACT

The invention relates to a treatment room (7) suitable for recording images of a human or animal body on the basis of a magnetic resonance (MR) imaging technique, the walls (7a), the ceiling (7b) and the floor (7c) of the treatment room forming an electromagnetic shield for a magnetic resonance (MR) imaging system (1) arranged in the treatment room, which MR imaging system comprises at least a target area (5) in which a human or animal body can be placed, a housing (2, 3, 4) comprising at least one main magnetic unit and at least one gradient magnetic unit for generating one or more magnetic fields in the target area (5), and at least one radio-frequency (RF) pulse unit (6) for generating an electromagnetic RF pulse in the target area (5). The invention further relates to a magnetic resonance imaging system comprising a target area in which a human or animal body can be placed, a housing comprising at least one main magnetic unit and at least one gradient magnetic unit for generating one or more magnetic fields in the target area, and at least one radio-frequency (RF) pulse unit for generating an electromagnetic RF pulse in the target area. In accordance with the invention, means (10, 11, 12, 13, 14, 15, 16, 17) are present which, in operation, counteract the electromagnetic effects (8) of the RF pulse in the treatment room (7) outside the target area (5).

21 Claims, 8 Drawing Sheets

U.S. PATENT DOCUMENTS

| | | |
|---|---|---|
| 6,198,285 B1 * | 3/2001 | Kormos et al. .............. 324/318 |
| 6,229,311 B1 * | 5/2001 | Abenaim .................... 324/322 |
| 6,249,006 B1 | 6/2001 | Sakiyama |
| 6,369,571 B1 * | 4/2002 | Damadian et al. .......... 324/318 |
| 6,590,391 B1 * | 7/2003 | Shudo et al. ............... 324/318 |
| 6,825,661 B2 * | 11/2004 | Leussler .................... 324/318 |
| 2001/0024121 A1 | 9/2001 | Kurihara et al. |
| 2002/0079894 A1 | 6/2002 | Boskamp |
| 2003/0001572 A1 | 1/2003 | Leussler |
| 2003/0016518 A1 | 1/2003 | Arz |
| 2006/0058633 A1 * | 3/2006 | Hoshino et al. ............ 600/410 |

FOREIGN PATENT DOCUMENTS

JP        2002263080        9/2002

* cited by examiner

SHIELDED TREATMENT ROOM AND DEVICE SUITABLE FOR RECORDING IMAGES ON THE BASIS OF MAGNETIC RESONANCE

The invention relates to a treatment room suitable for recording images of a human or animal body on the basis of magnetic resonance (MR), wherein the floor, the ceiling and the walls of the treatment room form an electromagnetic shield for a magnetic resonance (MR) imaging device arranged in the treatment room, which MR imaging device comprises at least a target area in which the human or animal body can be accommodated, a housing comprising at least one main magnetic unit and at least one gradient magnetic unit for generating one or more magnetic fields in the target area, as well as at least one radio frequency (RF) pulse unit for supplying an electromagnetic RF pulse to the target area.

The invention also relates to a magnetic resonance imaging device comprising a target area in which the human or animal body can be accommodated, a cryostat comprising at least one main magnetic unit and at least one gradient magnetic unit for generating one or more magnetic fields in the target area, as well as at least one radio frequency (RF) pulse unit for supplying an electromagnetic RF pulse to the target area.

The imaging technique based on magnetic resonance (MR) presently is one of the most used techniques to generate images of the internal organs of the human or animal body for the purpose of medical diagnostics.

By means of an MR imaging device a patient placed in the target area is subjected to a magnetic main field $B_0$ generated by the main magnetic unit. The protons ($H^+$ particles) present in the patient's body that act as small magnetic dipoles are thus oriented partly in the same direction by the main magnetic field.

The temporary introduction of a radio-frequency electromagnetic pulse (RF pulse) into the target area causes the magnetically oriented protons to become briefly imbalanced. As a result of the magnetic main field $B_0$, the imbalanced protons try to resume their orientation with respect to this field. During this re-orientation, the imbalanced protons are subject to a precession movement around their orientation axis until the protons have resumed their original orientation with respect to the magnetic main field $B_0$.

Said precession movement, which causes the protons to fall back to their original orientation with respect to the magnetic main field $B_0$, is accompanied by the issuance of an electromagnetic signal. By receiving and analyzing the multitude of precession signals, an accurate image can be obtained of the internal organs of the body of the patient.

At present, more and more "open"-type MR imaging devices are applied, wherein the target area is no longer completely surrounded by the housing (cryostat or permanent magnetic unit) in which the magnetic units are accommodated, as is the case with MR imaging devices of the "closed" or cylindrical or tubular type; said open-type MR imaging devices have a more open design, with the magnetic units being arranged below and above or on either side of the target area in the housing.

As a result of the open design of this novel generation of MR imaging devices, in particular the electromagnetic phenomena resulting from the RF pulse are transmitted to the surrounding environment in the treatment room. In the case of the MR imaging devices of the "closed" cylindrical type, this effect occurs to a much smaller degree since the "closed" construction of the target area causes the RF pulse to be captured or shielded by the housing.

The effects of the electromagnetic phenomena from the RF pulse to the surrounding environment in the treatment room are further enhanced by the development of MR imaging devices using stronger magnetic fields (and hence also RF pulses having a higher frequency).

It has been found that the electromagnetic effects of the RF pulse outside the target area influence the environment (medical staff as well as equipment). An example of this is the electric current generated by the RF pulse, which electric current runs through the human body. In addition, the electromagnetic effects of the RF pulse outside the target area cause the quality of the ultimately obtainable images of the internal organs of the patient to be adversely affected.

Therefore, it is an object of the present invention to minimize these electromagnetic effects of the RF pulse outside the target area in the treatment room.

According to the invention, the treatment room is characterized in that means are present which, during operation, counteract the electromagnetic effects of the RF pulse in the treatment room outside the target area.

It is thus precluded, particularly also in the case of MR display devices of the so-termed "open" type, that the RF pulse adversely affects the environment outside the target area. The electromagnetic effects of these RF pulses are counteracted, so that in the case of MR imaging devices of the so-termed "open" type, the environment/bystanders are exposed to an acceptable RF load, even at higher, stronger magnetic fields.

More specifically, in an embodiment, the means are placed in the treatment room and, in particular, they are provided on at least one of the walls and/or the ceiling and/or the floor of the treatment room.

In an embodiment, the means includes a layer made of stainless steel.

In another embodiment, the means includes an electro conductive (dissipating) coating.

In yet another functional embodiment, the means includes one or more elements made of a material that absorbs the electromagnetic waves. These elements are embodied so as to be, for example, ferrite tiles. It is essential for these elements that the electromagnetic waves are absorbed, and hence reflected poorly, by said elements.

The electromagnetic effects of the RF pulse in the treatment room can be very functionally counteracted in that, in accordance with the invention, the elements have an open fiber structure of electro conductive material.

In another very functional design-in accordance with the invention, the electro conductive (dissipating) elements have a spatial structure directed towards the interior of the treatment room.

In another functional embodiment, the means can be moved relative to the MR imaging device in the treatment room, so that the counteracting of electromagnetic effects can be adapted effectively and readily to the operating circumstances of the MR imaging device.

In a specific embodiment designed to counteract or eliminate the magnetic effects of the RF pulse, the means comprise at least one LCR circuit which is oriented more or less perpendicularly to the magnetic field generated by the RF pulse.

In another embodiment, which is designed specifically to counteract or eliminate the electric effects of the RF pulse, the means comprise at least one LCR dipole antenna which is oriented more or less parallel to the electric field generated by the RF pulse.

In a particular embodiment of the LCR dipole antenna, wherein the antenna is electrically connected to the electromagnetic shield, the LCR dipole antenna has an electric length equal to $\frac{1}{4}\lambda$, where $\lambda$ is equal to the wavelength of the RF pulse.

In another embodiment of the LCR dipole antenna, wherein, contrary to the above embodiment, the dipole antenna is connected to the electromagnetic shield so as to electrically shielded there from, the dipole antenna has an electric length equal to $\frac{1}{2}\lambda$, where $\lambda$ is equal to the wavelength of the RF pulse.

It has further been found that the provision of an electro conductive plane in the treatment room can also be considered a functional embodiment of the means according to the invention.

In accordance with a further characteristic of the invention, the means may also form part of the MR imaging device, and the means may have a high electric resistivity and they may be provided on the cryostat such that they enclose the RF unit.

More specifically it has been found that the electromagnetic effects in the treatment room outside the target area can be advantageously counteracted if the means includes a large number of abutting waveguides, at least one end of the waveguide being electrically open. If necessary, both ends may be electrically open.

More specifically, the electric length of the waveguide should, in this case, be equal to $\frac{1}{4}\lambda$, where $\lambda$ is equal to the wavelength of the RF pulse. A similar functionality can be achieved by providing, in accordance with the invention, a reactive impedance near at least one or both open ends of the waveguide. The reactive impedance and the waveguide jointly form a high impedance for the RF currents through the housing.

The magnetic resonance imaging device mentioned in the opening paragraph also forms part of the invention if it is provided with one or more of the means described hereinabove.

These and other aspects of the invention are apparent from and will be elucidated with reference to the embodiment(s) described hereinafter.

In the drawings:

For simplicity and a better understanding of the invention, like reference numerals refer to like parts in the following description.

Figure 1A:
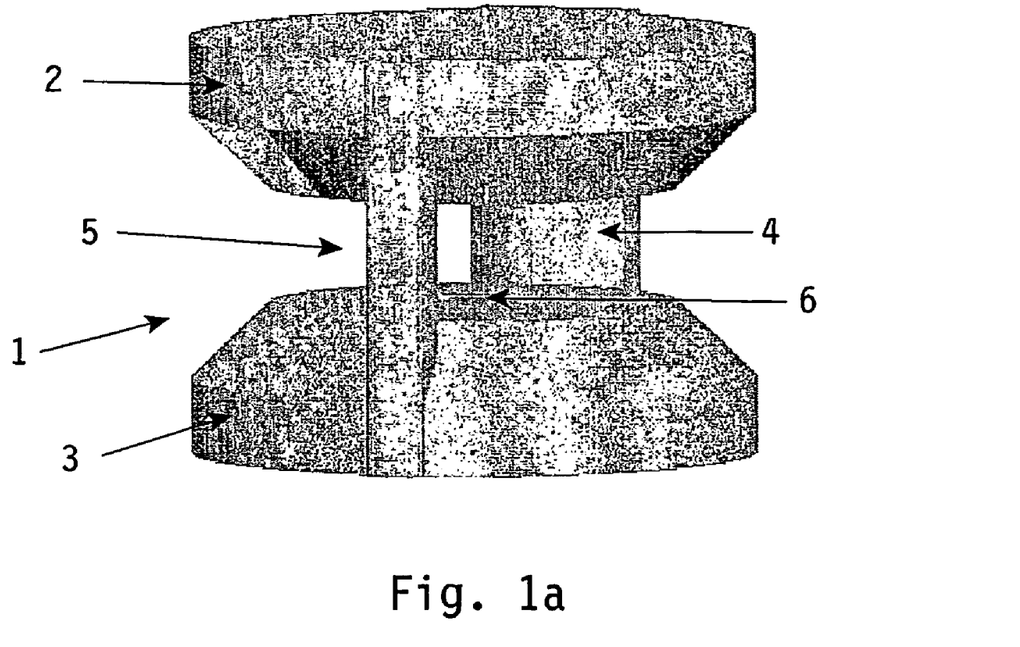
FIGS. 1a and 1b are diagrammatic views of a magnetic resonance imaging device of the "open" type.
Figure 1B:
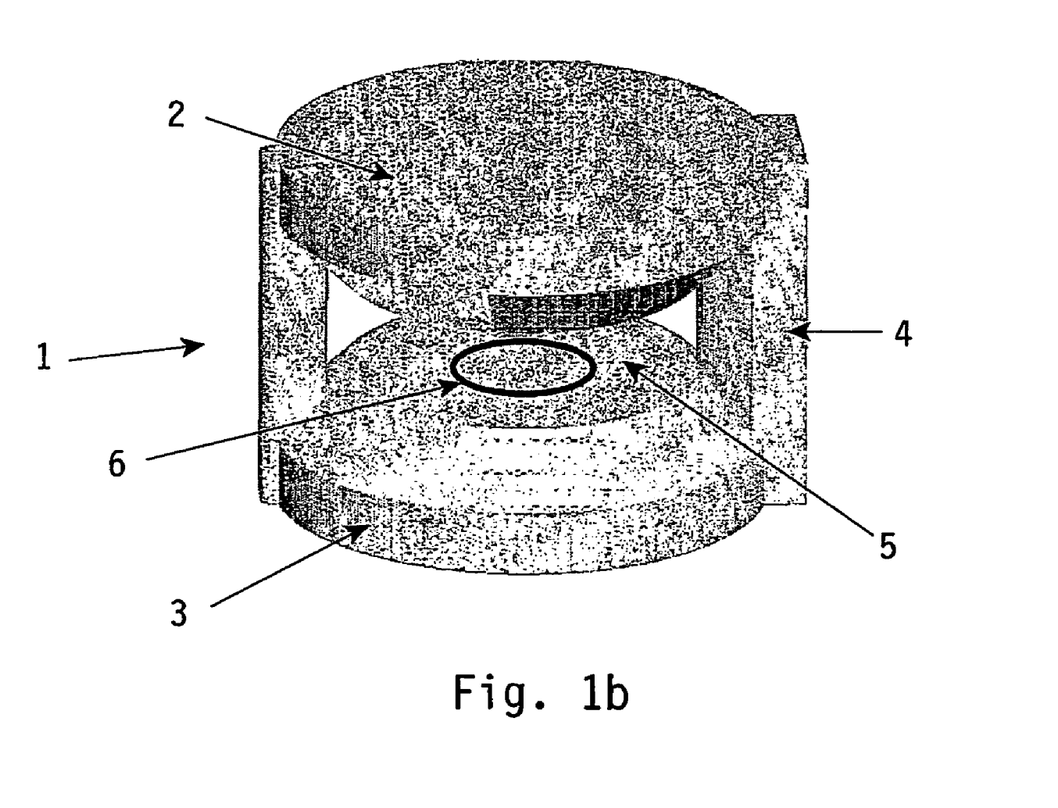

FIGS. 1a and 1b are diagrammatic views of an imaging device that operates according to the principle of magnetic resonance (MR). FIGS. 1a and 1b more particularly show an MR imaging device of the so-termed "open" type.

An MR imaging device 1 comprises a housing 2, 3, 4, referred to as "cryostat" or "permanent magnet" in technical terms. The housing 2, 3, 4 accommodates at least one main magnetic unit and at least one gradient magnetic unit (both of which are not shown) to generate one or more magnetic fields in the target area 5 in which a human or animal body can be accommodated.

By means of the main magnetic unit and the gradient magnetic unit accommodated in the housing 2, 3, 4, magnetic fields (main magnetic field $B_0$ and gradient magnetic fields $G_x$, $G_y$, $G_z$) can be generated in the target area 5 during operation. The protons in the body of a patient present in the target area 5 will be partly oriented in the direction of the main magnetic field $B_0$.

By means of a radio-frequency pulse unit 6, also accommodated in the MR imaging device, an RF pulse is supplied to the target area 5, causing the protons ($H^+$) oriented by the magnetic field $B_0$ and serving as a dipole to be temporarily out of balance. After the cessation of the RF pulse, the imbalanced protons will resume their orientation with respect to the magnetic main field $B_0$ prevailing in the target area 5.

This re-orientation is accompanied by a precession movement that is carried out by the imbalanced protons around their axis of orientation until the protons have resumed their original orientation with respect to the magnetic main field $B_0$.

Said precession movement, which causes the protons in the body of the patient to "fall back" to the orientation defined by the magnetic main field, is accompanied by the emission of an electromagnetic signal.

All of the precession signals emitted by the protons are picked up by a reception coil unit and are further processed to obtain an accurate image of the internal organs of the body of the patient.

As outlined in the introductory part, the MR imaging devices of the open type as shown in FIGS. 1a and 1b have the drawback that the target area 5 is no longer completely enclosed by the housing 2, 3, 4 (cryostat or permanent magnetic unit), as is the case with MR imaging devices of the "closed" type. As a result of the open character of the novel generation of MR imaging devices, the electromagnetic phenomena resulting from the RF pulse supplied each time to the target area 5 are transmitted to the surrounding environment in the treatment room in which the MR imaging device is arranged. These electromagnetic phenomena of the RF pulse are further enhanced by the development of MR imaging devices using stronger magnetic fields (and thus also requiring RF pulses having higher frequencies).

Figure 2:
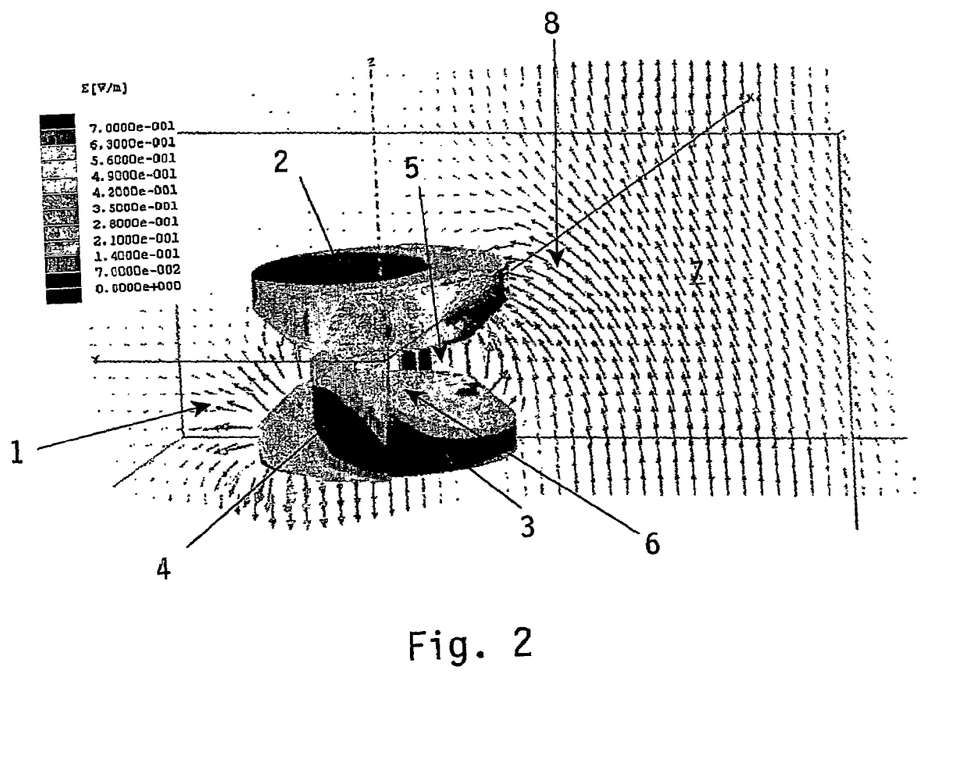
FIG. 2 is an example of a spatial scattering diagram of the electric field caused by an RF pulse.

FIG. 2 schematically shows an example of a scatter diagram of the electric field outside the target area 5 of the RF pulse supplied by the RF pulse unit 6 to the target area 5. Although the RF pulse should be active, primarily and solely, in the target area 5, i.e. to temporarily throw out of balance the oriented protons in the body of the patient, it is clearly visible that the electromagnetic effects of the RF pulse are transmitted beyond the target area 5 and reach the treatment room 7 where the MR imaging device 1 is arranged. This is shown in FIG. 2 by means of the field lines 8.

In order to minimize the influence of these electromagnetic effects, particularly the RF-load thereof, on the environment (medical staff on site and equipment), it is proposed in accordance with the invention to use means which, in operation, counteract the electromagnetic effects of the RF pulse in the treatment room 7 outside the target area 5.

Figure 3:
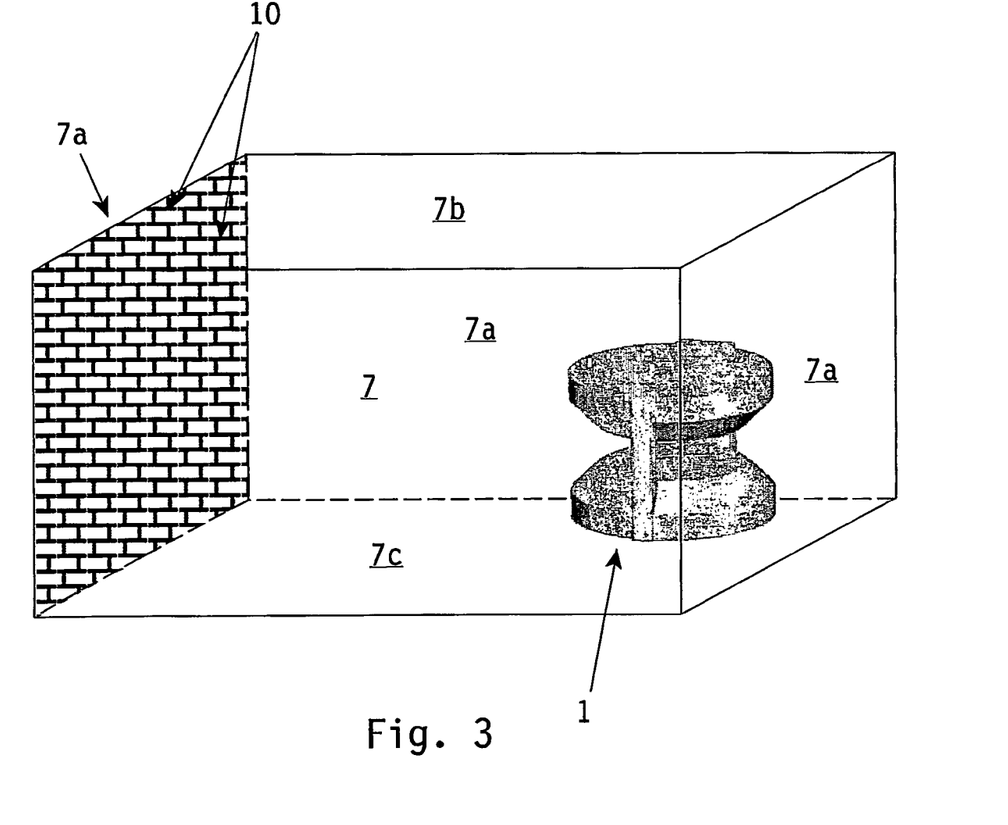
FIG. 3 shows a first embodiment of the means in accordance with the invention provided in a treatment room.

FIG. 3 shows a first embodiment of the means used to counteract, in operation, the electromagnetic effects 8 of the RF pulse in the treatment room 7. Shown is a schematic spatial view of the treatment room 7 which is surrounded by the walls 7a, the ceiling 7b and the floor 7c. The space 7 forms an electric shield ("Faraday cage") for the MR imaging device.

In accordance with the invention, the means 10 are provided on at least one of the walls 7a and/or on the ceiling 7b and/or on the floor 7c of the treatment room 7, and may include, for example, a layer of stainless steel. In another embodiment, the means may include an electro conductive coating applied to one or more of the walls 7a and/or to the ceiling 7b and/or to the floor 7c. Said two measures reduce the occurrence of a standing electromagnetic wave in the treatment room 7 between the imaging device 1 and one of the walls 7a. As a matter of fact, these measures cause an increase in electric resistance for the electric currents in the wall as compared to the electric resistance of the wall made of, for example, copper.

By virtue thereof it is precluded that, particularly in the case of so-termed "open"-type MR imaging devices 1, the RF pulse exerts a lasting negative effect on the environment 7 outside the target area 5. As a result, the environment/bystanders are exposed to a normal work load even in the case of higher-frequency RF fields.

In an embodiment shown in FIG. 3, the means includes one or more elements 10. It is essential for these elements that the electromagnetic waves traveling through the treatment room 7 are poorly reflected by these elements at the location of the walls 7a, the ceiling 7b and the floor 7c and that these electromagnetic waves are absorbed by said elements via the electric shield that forms/encloses the treatment room 7. More specifically, these elements are embodied so as to be ferrite tiles 10. In a different embodiment, the elements may have an open fiber structure of electro conductive material.

Figure 4:
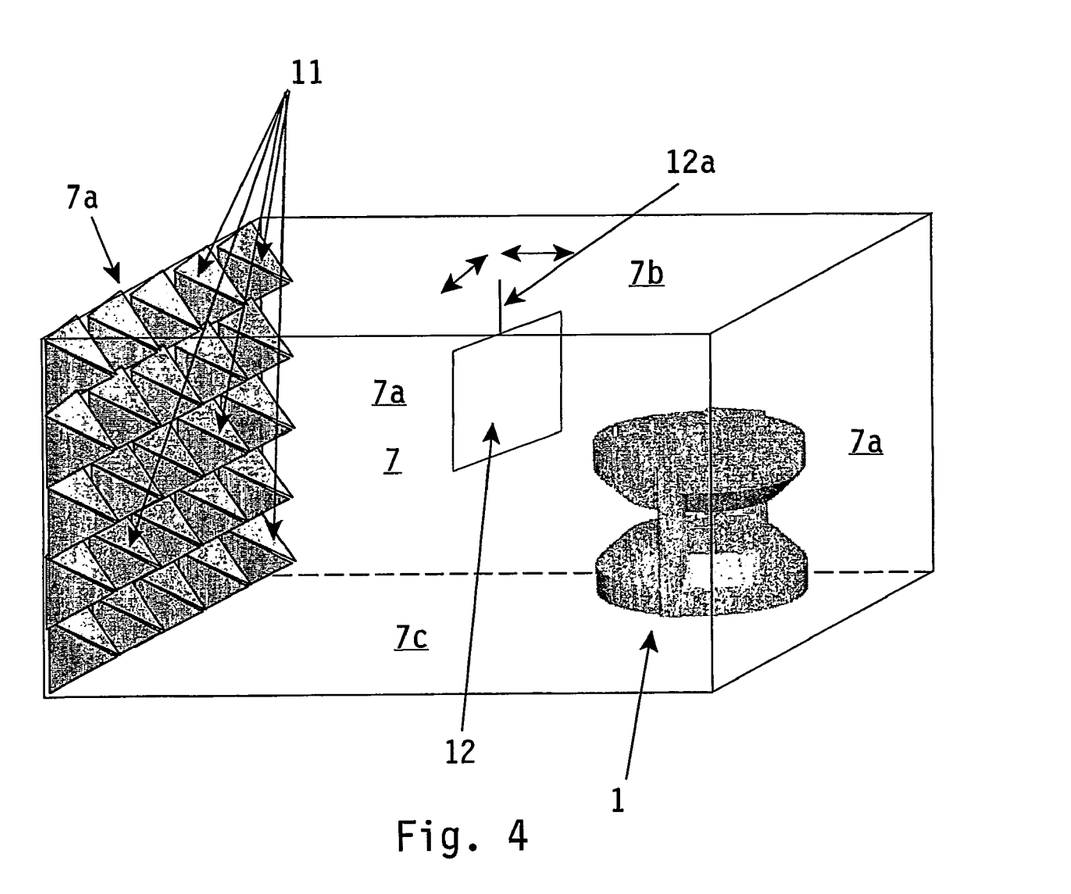
FIG. 4 shows a second embodiment of the means according to the invention provided in a treatment room.

Another embodiment is shown in FIG. 4, wherein the means 11 includes electro conductive elements having a spatial structure directed towards the interior of the treatment room 7. In FIG. 4, these means 11 are embodied so as to be pyramid-shaped elements 11.

Another embodiment, as shown in FIG. 4, comprises at least one electro conductive plane 12 which is electrically or capacitively connected, via connection 12a, to the treatment room 7 (7a-7b-7c) serving as a Faraday cage. The means 12 are embodied so as to be an electro conductive plane, and are preferably arranged at locations where the electric field of the standing electromagnetic wave coupled to the treatment room 7 by the RF pulse is strongest.

In a specific embodiment, the electro conductive plane 12 has a bent (square) shape and is capacitively connected, just above the housing 2, 3, 4, to the ceiling 7b.

The electric field is thus picked up by the electro conductive plane 12 and removed from the treatment room 7 via the electric connection 12a and the electric shield 7a-7b-7c. In other words, by means of this provision the electromagnetic effects resulting from the standing electromagnetic wave in the treatment room 7 are reduced or eliminated.

In a specific embodiment, the means 12 can be moved in the treatment room 7 relative to the MR imaging device 1. As a result, the electro conductive plane 12 can be positioned anywhere in the treatment room 7 (see both arrows in the ceiling 7b) dependent upon the type and the shape of the electromagnetic effects occurring in the treatment room 7 during operation of the MR imaging device 1 (in particular the operation/activation of the RF pulse unit 6).

The electro conductive plane 12 may alternatively be embodied so as to be a strip provided around the housing, which strip is connected, on the one hand, to the housing 2, 3, 4 and, on the other hand, to the ceiling 7c.

Figure 5A:
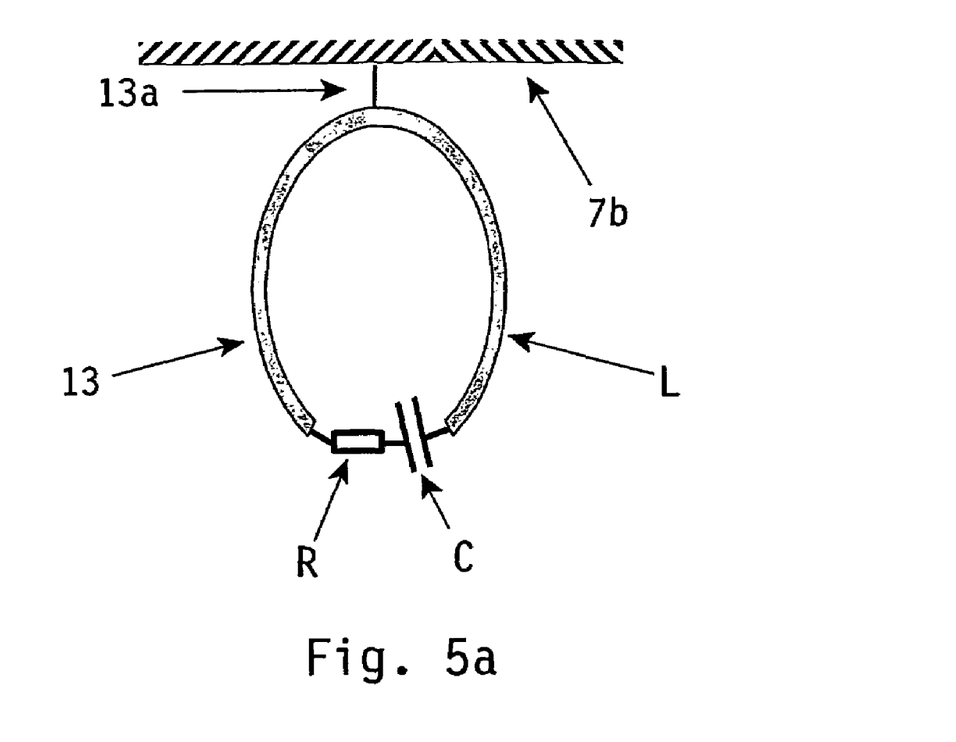
FIGS. 5a and 5b show a third and a fourth embodiment of the means according to the invention provided in a treatment room.
Figure 5B:
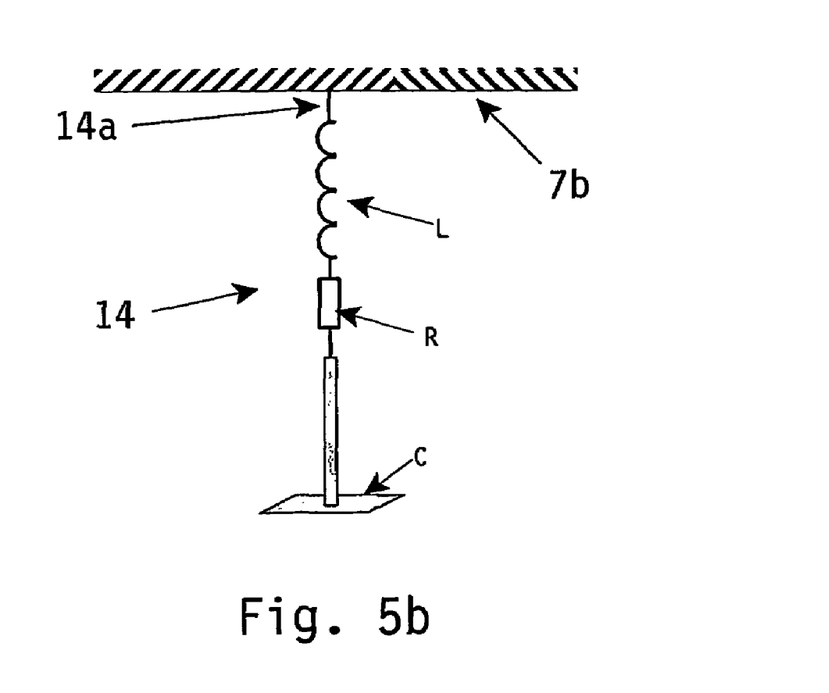

Other embodiments of the electro conductive plane shown in FIG. 4 are shown in FIGS. 5a and 5b. FIG. 5a shows an LCR circuit 13 which can be connected to the wall 7a or the ceiling 7b of the electric shield by means of an electric connection 13a The LCR circuit 13 is used to pick up the magnetic component B of the electromagnetic phenomena of the RF pulse emitted by the RF unit 6. For this purpose, the LCR circuit 13 should be oriented more or less perpendicularly to the magnetic field component B generated by the RF pulse.

Another embodiment of the means which may be accommodated in the treatment room 7 and which may or may not be movable is shown in FIG. 5b and includes an LCR dipole antenna 14. The LCR dipole antenna 14 is used to pick up the electric field component E generated by the RF pulse and thus should be oriented more or less parallel to this electric field.

The measure to counteract the electromagnetic effects of the RF pulse in the treatment room 7 outside the target area 5, as shown in FIG. 5b, may be implemented in two different embodiments.

In the first embodiment, the LCR dipole antenna 14 is electrically connected, by means of the connection 14a, to the electromagnetic shield (Faraday cage) (walls 7a or ceiling 7b) and has an electric length equal to $\frac{1}{4}\lambda$, where $\lambda$ is equal to the wavelength of the RF pulse.

In another embodiment, the connection 14a is not an electric connection but rather an electrically insulated connection to the electric shield 7, and the electrically shielded LCR dipole antenna has an electric length equal to $\frac{1}{2}\lambda$, where $\lambda$ is equal to the wavelength of the RF pulse.

Analogous to the embodiment of the means 12 shown in FIG. 4, also the LCR circuit 13 and the LCR dipole antenna 14 can be movably arranged in the treatment room 7.

It is also possible, of course, to arrange a plurality of LCR circuits 13 or LCR dipole antennas 14 in the treatment room 7.

In another embodiment, the means for counteracting electromagnetic effects of the RF pulse supplied by the RF unit 6 are not arranged in the treatment room 7, but form part of the MR imaging device 1.

Figure 6:
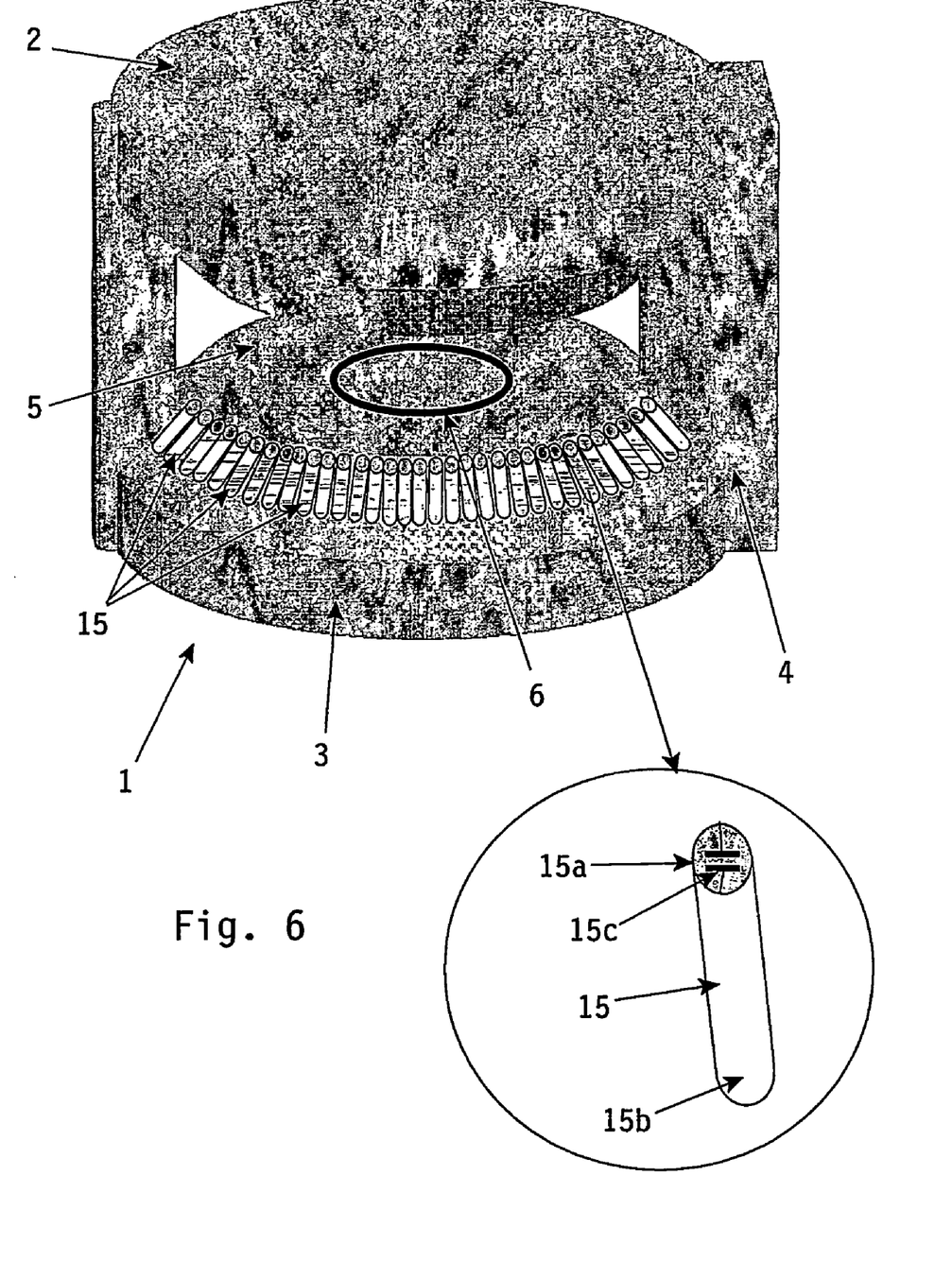
FIG. 6 shows a first embodiment of an MR imaging device provided with means according to the invention.

An embodiment of this is shown in FIG. 6, wherein these means have a comparatively high impedance relative to the resistivity of the material from which the housing 2, 3, 4 is made, and are provided on the housing (the cryostat or permanent magnet) in such a manner that they fully surround the RF unit 6.

In FIG. 6, these means includes a large number of interconnected, abutting waveguides 15. Said waveguides 15 are open at least at one end 15a, and in this embodiment, the other end 15b of the waveguides 15 is closed. More specifically, the electric length of each waveguide 15 is equal to $\frac{1}{4}\lambda$, where $\lambda$ is equal to the wavelength of the RF pulse. However, the waveguide 15 may alternatively be embodied so as to be open at both ends.

Although not shown in FIG. 6, the adjacent, interconnected waveguides 15 must also be provided on the part 2 (situated above the RF unit).

An additional functionality to counteract the coupling of the RF pulse emitted by the RF unit 6 to the treatment room 7 can be achieved, in a specific embodiment, by a reactive element 15c which may be arranged near one or both open ends 15a-15b of the waveguide 15. The object is to provide the waveguide 15 and the reactive impedance 15c with a high impedance for the RF currents through the housing 2, 3, 4.

Figure 7:
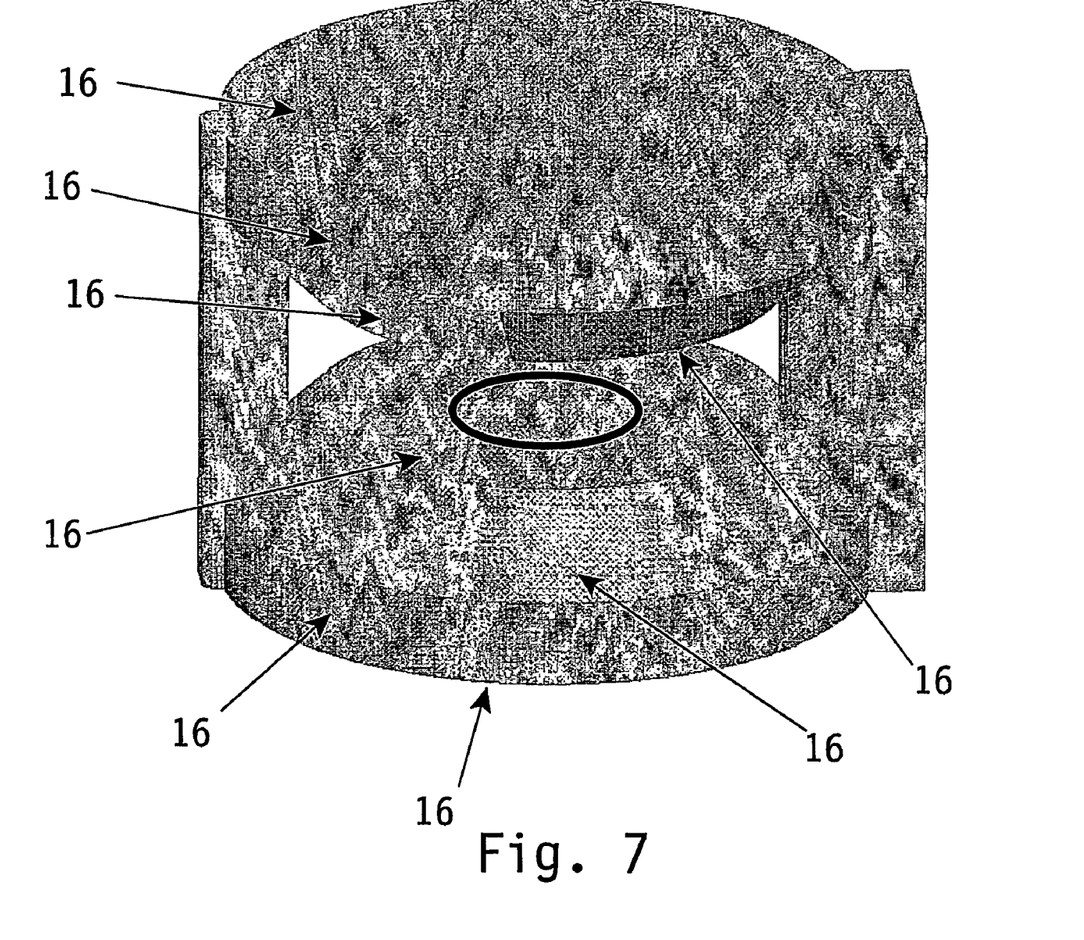
FIG. 7 shows a second embodiment of an MR imaging device provided with means according to the invention.

In another embodiment, as shown in FIG. 7, the means having a comparatively high electric resistivity includes a coating or layer 16, which is applied to the surfaces of the housing 2 which are in direct contact with the electromagnetic effects of the RF pulse emitted by the RF unit 6.

Figure 8:
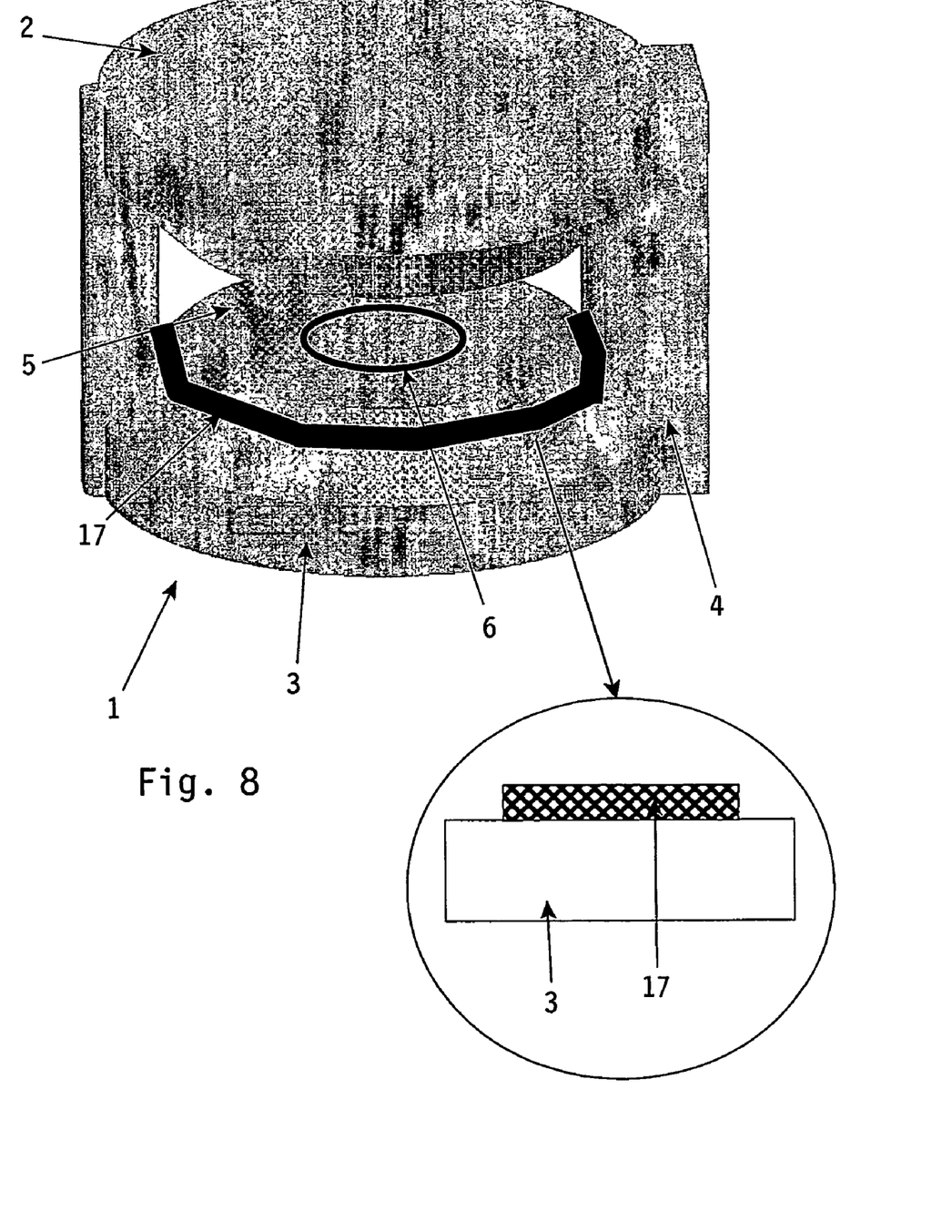
FIG. 8 shows a third embodiment of an MR imaging device provided with means according to the invention.

If necessary, as shown in the embodiment of FIG. 8, the material having a high electric resistivity may be provided in the form of a ring 17 around the RF unit 6 in order to form a high electric barrier to the RF pulse emitted by the RF unit. The ring 17 must be provided on the part 3 as well as on the part 2 of the housing.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance imaging device disposed in a treatment room comprising:
    a target area in which the human or animal body can be accommodated,
    a housing comprising a main magnetic unit and a gradient magnetic unit for generating one or more magnetic fields in the target area,
    at least one radio frequency pulse unit for supplying an electromagnetic RF pulse to the target area, and
    a 3D spatial structure of electro conductive elements that absorb electromagnetic RF waves, the spatial structure of electro conductive elements being disposed in the treatment room directed towards the target area for counteracting the electromagnetic effects of the RF pulse in the treatment room outside the target area.

2. The imaging device as claimed in claim 1, wherein the spatial structure is placed in the treatment room.

3. The imaging device as claimed in claim 2, wherein the spatial structure is provided on walls and/or a ceiling and/or a floor of the treatment room.

4. A treatment room suitable for recording images of a human or animal body on the basis of magnetic resonance, wherein walls, a ceiling, and a floor of the treatment room form an electromagnetic shield for a magnetic resonance imaging device arranged in the treatment room, which MR imaging device comprises:
    a target area in which the human or animal body can be accommodated;
    a main magnetic unit and a gradient magnetic unit for generating one or more magnetic fields in the target area;
    a radio frequency pulse unit for supplying an electromagnetic RF pulse to the target area; and
    at least one LCR dipole antenna disposed in the treatment room and oriented substantially parallel to the electric field generated by the RF pulse for counteracting the electromagnetic effects of the RF pulse in the treatment room outside the target area.

5. The treatment room as claimed in claim 4, further including a layer made of stainless steel mounted on at least one of the walls, the ceiling, and the floor.

6. The treatment room as claimed in claim 4, further including an electro conductive coating on at least one of the walls, the ceiling, and the floor.

7. The treatment room as claimed in claim 4, wherein the dipole antenna can be moved relative to the MR imaging device in the treatment room.

8. The treatment room as claimed in claim 4, wherein the LCR dipole antenna is electrically connected to the electromagnetic shield and has an electric length equal to $\frac{1}{4}\lambda$, where $\lambda$ is equal to the wavelength of the RF pulse.

9. The treatment room as claimed in claim 4, wherein the LCR dipole antenna is connected to the electromagnetic shield so as to be electrically shielded there from, and has an electric length equal to $\frac{1}{2}\lambda$, where $\lambda$ is equal to the wavelength of the RF pulse.

10. A treatment room suitable for recording images of a human or animal body on the basis of magnetic resonance, wherein the walls, the ceiling, and the floor of the treatment room form an electromagnetic shield for a magnetic resonance imaging device arranged in the treatment room, comprising:
    a target area in which the human or animal body can be accommodated;
    a housing comprising a main magnetic unit and a gradient magnetic unit for generating one or more magnetic fields in the target area;
    a radio frequency pulse unit for supplying an electromagnetic RF pulse to the target area; and
    a large number of abutting waveguides, provided with at least one electrically open end for counteracting the electromagnetic effects of the RF pulse in the treatment room outside the target area.

11. The treatment room as claimed in claim 10, further including one or more elements made of a material that absorbs the electromagnetic waves.

12. The treatment room as claimed in claim 11, wherein the elements include ferrite tiles.

13. The treatment room as claimed in claim 11, wherein the elements have an open fiber structure of electro conductive material.

14. The treatment room as claimed in claim 11, wherein the elements have a spatial electro conductive structure directed towards the interior of the treatment room.

15. The treatment room as claimed in claim 10, wherein the waveguides form part of the MR imaging device.

16. The treatment room as claimed in claim 15, wherein the waveguides have a comparatively high electric resistivity as compared to the resistivity of the material of the housing, and are provided on the housing so as to enclose the RF unit.

17. The treatment room as claimed in claim 10, wherein the electric length of the waveguide is equal to $\frac{1}{4}\lambda$, where $\lambda$ is equal to the wavelength of the RF pulse.

18. The treatment room as claimed in claim 10, wherein reactive elements are provided near at least one end of the waveguides.

19. A treatment room suitable for recording images of a human or animal body on the basis of magnetic resonance, wherein the treatment room is surrounded by an electromagnetic shield for a magnetic resonance imaging device arranged in the treatment room, which MR imaging device comprises:
    a target area in which the human or animal body can be accommodated,
    a housing comprising a main magnetic unit and gradient magnetic unit for generating one or more magnetic fields in the target area, a radio frequency pulse unit for supplying an electromagnetic RF pulse to the target area, and
a wall, ceiling, and/or floor structure in the treatment room for counteracting the electromagnetic effects of the RF pulse in the treatment room outside the target area, the structure including at least one of:
a layer made of stainless steel,
ferrite tiles, and
an open electro conductive fiber construction.

20. The treatment room as claimed in claim 1, further including at least one LCR circuit which is oriented substantially perpendicularly to a magnetic field generated by the RF pulse.

21. The treatment room as claimed in claim 1, further including at least one electro conductive plane which can be arranged in the treatment room.

* * * * *